United States Patent [19]

Tezuka

[11] Patent Number: 5,239,208
[45] Date of Patent: Aug. 24, 1993

[54] CONSTANT CURRENT CIRCUIT EMPLOYING TRANSISTORS HAVING SPECIFIC GATE DIMENSIONS

[75] Inventor: Akitoshi Tezuka, Osaka, Japan

[73] Assignee: Matsushita Electric Industrial Co., Ltd., Osaka, Japan

[21] Appl. No.: 829,518

[22] Filed: Jan. 31, 1992

Related U.S. Application Data

[63] Continuation of Ser. No. 402,395, Sep. 5, 1989, abandoned.

[30] Foreign Application Priority Data

Sep. 5, 1988 [JP] Japan .................. 63-221735

[51] Int. Cl.$^5$ .................. H03K 3/01; H03K 3/353
[52] U.S. Cl. .................. 307/304; 307/443; 307/448; 307/451; 307/296.1; 307/296.8
[58] Field of Search .............. 307/443, 448, 451, 304, 307/296.1, 296.8

[56] References Cited

U.S. PATENT DOCUMENTS

| | | | |
|---|---|---|---|
| 3,260,863 | 7/1966 | Burns et al. | 307/451 |
| 3,299,291 | 1/1967 | Warner, Jr. et al. | 307/448 |
| 3,898,477 | 8/1975 | Buchanan | 307/448 |
| 3,980,896 | 9/1976 | Kato | 307/451 |
| 4,302,690 | 11/1981 | Gollinger et al. | 307/451 |
| 4,682,055 | 7/1987 | Upadhyayula | 307/451 |
| 4,686,387 | 8/1987 | Rumelhard | 307/304 |
| 4,896,059 | 1/1990 | Goodwin et al. | 307/451 |
| 4,996,447 | 2/1991 | Tanoi | 307/448 |

*Primary Examiner*—William L. Sikes
*Assistant Examiner*—Margaret Rose Wambach
*Attorney, Agent, or Firm*—Lowe, Price, LeBlanc & Becker

[57] ABSTRACT

A semiconductor integrated circuit including a constant current circuit or an active load circuit, which includes two field effect transistors having the same type of channels connected in series with each other, wherein the threshold voltages of the field effect transistors are different in value from each other, and the K-values of the field effect transistors are different from each other and the threshold voltages and the K-values of the field effect transistors satisfy a predetermined condition, or wherein the gate widths of the field effect transistors are different from each other and the gate lengths of the field effect transistors are different from each other.

10 Claims, 6 Drawing Sheets

CONSTANT CURRENT CIRCUIT EMPLOYING TRANSISTORS HAVING SPECIFIC GATE DIMENSIONS

This application is a continuation of application No. 07/402,395, filed Sep. 5, 1989, now abandoned.

FIELD OF THE INVENTION

This invention generally relates to a semiconductor integrated circuit consisting of a plurality of field effect transistors (hereunder abbreviated as FETs) and more particularly to a high-performance semiconductor integrated circuit including a circuit having constant current characteristics.

DESCRIPTION OF THE RELATED ART

Typical circuits having constant current characteristics are constant current circuits and active load circuits.

Constant current circuits are widely used as a part of circuits such as differential amplifiers, source followers and the like. As is well known, the characteristics of the latter circuits are determined by those of the constant current circuits.

FIG. 7 shows a typical constant current circuit using an FET operated at a saturation level of drain current. This constant current is composed of an FET Q, of which the source is connected to a low level power line (that is, a ground line). A gate bias voltage $V_b$ is supplied to the gate of the FET $Q_1$ from an external circuit. FIG. 8 illustrates the voltage-current characteristic of the constant current circuit of FIG. 7. As is seen from this graph, when a voltage $V_d$ applied to the constant current circuit is higher than a predetermined value, the current flowing through the FET $Q_1$ moves the FET into the saturation state and becomes almost constant. Thus, this voltage-current characteristic curve shows a constant current characteristic. The circuit of FIG. 7 utilizes the constant current characteristic shown in this graph. The gate bias voltage $V_b$ is generated by an external gate-bias-voltage generating circuit in the semiconductor integrated circuit. However, a description of the details of the generating circuit, which is not essential for the present invention, are omitted herein.

As is known an active load circuit is used as a load in differential amplifiers or in various kinds of the switching circuits. The circuit of FIG. 9 has been widely used as an active load circuit. This conventional active load circuit includes a depletion mode FET $Q_2$. The drain of the FET $Q_2$ is connected to a high level power line $V_{dd}$ and the gate of the FET is connected to the source thereof, from which an output $V_s$ of the active load circuit is obtained. FIG. 10 shows a voltage-current characteristic of the conventional active load circuit of FIG. 9. In the range where a current $I_d$ flowing through the load is small, the output voltage $V_s$ of the active load circuit is inversely proportional to the current $I_d$. However, when the current $I_d$ is larger than a predetermined value, the current flowing through the FET $Q_2$ move the FET into the saturation state, and the voltage $V_s$ radically changes in response to a change of the current $I_d$. Thus, it is that the active load circuit has a large differential resistance. Most active load circuits using FET's have such large differential resistances, and are characteristically able to obtain a large output voltage in comparison to an active load circuit using a resistance instead of an FET.

As is well known, FETs exhibit what is called channel length modulation effects. As a result, the drain current of the FET changes in response to change in the voltage developed across the drain and the source of the FET, also to the voltage developed across the gate and the source of the FET.

Conventional constant current circuits have certain problems due to such channel length modulation effects. FIG. 8 shows a voltage-current characteristic of a conventional constant current circuit. As is seen from this graph, even when the voltage $V_d$ applied to the constant current circuit becomes larger than a predetermined value and the FET is brought into the saturation state, the current $I_d$ flowing through the constant current circuit substantially changes in response to the change of the voltage $V_d$.

As stated above, the constant current circuit is used as a part of a differential amplifier, a source follower or the like which operate to cause a change in the voltage applied to the constant current circuit. Thus, the current flowing through the constant current circuit changes when the circuit operates. As a result, in a differential amplifier, source follower or the like, the linear relation between the input and the output signals is lost, and further distortion is caused in the output signals.

With conventional constant current circuits, there are no effective countermeasures except to suppress the channel length modulation effects in order to decrease the change of the current $I_d$ caused by the change of the voltage $V_d$. As is well known, it is necessary only to increase the gate length of an FET in order to suppress the channel length modulation effects. However, when the gate length of an FET is increased, the transconductance of the FET decreases. Therefore, it is necessary to increase the gate width of the FET to handle a specified amount of current through the FET. However, the gate capacitance of the FET increases in proportion to the product of the gate width and the gate length thereof. Thus, the operating rate of the FET decreases. For this reason, the gate length of the FET used in a constant current circuit cannot be increased. Consequently, in a conventional circuit, it is not practical to substantially suppress the channel length modulation effects.

As described above, conventional constant current circuits have a drawback in that the current flowing through the constant current circuit changes due to a change in the voltage applied thereto. Further, there have been no effective countermeasures for resolving this problem.

Similarly, in conventional active load circuits, there is a problem which is caused by channel length modulation effects. FIG. 10 shows a voltage-current characteristic of a conventional active load circuit. This graph indicates that even when the current $I_d$ flowing through the active load current becomes larger than a predetermined amount and brings the FET into the saturation state, the output voltage $V_s$ considerably changes in response to the change of the current $I_d$.

As described above, the active load circuit in FIG. 9 is used as a load with a differential amplifier circuit, various switching circuits or the like. In these circuits, considering the operating rate, the voltage gain and the power dissipation, it is desirable that the differential resistance be large when the current flowing through the active load circuit is in the saturation state, namely, that the voltage $V_s$ substantially changes when the current $I_d$ varies.

In order to increase the change of voltage $V_s$ caused by that of the current $I_d$ in the conventional active load circuit of FIG. 9, there have been no effective countermeasures but to suppress the channel length modulation effects of the FET. As above stated, it is necessary only to increase the gate length of the FET in order to suppress the channel length modulation effects. However, as described above, the gate length of the FET used in the active load circuit cannot be increased and thus it is not practical to considerably suppress the channel length modulation effects of the FET.

As described above, conventional active load circuits have a drawback in that the change of the output voltage of the active load circuit cannot be large in response to the variation of the current flowing through the active load circuit. Further, there have been no effective countermeasures for solving this problem.

SUMMARY OF THE INVENTION

The present invention is accomplished to solve the above-described problems of conventional constant current circuits and of active load circuits.

It is, accordingly, an object of the present invention to provide a semiconductor integrated circuit including a constant current circuit which can substantially suppress the change of the current flowing therethrough even when the voltage applied thereto varies while using an FET having large channel length modulation effects.

Further, it is another object of the present invention to provide a semiconductor integrated circuit including an active load circuit in which the output voltage thereof can be substantially changed in response to the change of the current flowing therethrough even when the current flowing therethrough varies while using an FET having large channel length modulation effects.

To achieve the foregoing objects and in accordance with a first aspect of the present invention, a semiconductor integrated circuit is provided which includes at least a constant current circuit which comprises first and second FETs having the same type channels, wherein the drain of the first FET is connected to the source of the second FET, the source of the first FET is connected to a low level power line, and the gates of the first and the second gates are connected to each other and are supplied with a constant gate bias voltage from an external circuit, and wherein the threshold voltage of the second FET is less than that of the first FET and the K-value of the second FET is larger than that of the first FET.

Further, in accordance with a second aspect of the present invention, a semiconductor integrated circuit is provided which includes at least a constant current circuit which comprises first and second FETs, wherein the drain of the first FET is connected to the source of the second FET, the source of the first FET is connected to a low level power line, and the gates of the first and the second FET's are connected to each other and are supplied with a constant gate bias voltage from an external circuit, and wherein the gate length of the second FET is less than that of the first FET and the gate width of the second FET is greater than that of the first FET.

Moreover, in accordance with a third aspect of the present invention, there is provided a semiconductor integrated circuit according to the first and second aspects of the present invention wherein the threshold voltages and the K-values of the first and the second FETs satisfy the following condition given by Equation (1):

$$V_b - V_{t2} > \{1 + \sqrt{(K_1 + K_2)}\}(V_b - V_{t1}) \tag{1}$$

where $V_{t1}$ denotes the threshold voltage of the first FET; $V_{t2}$ the threshold voltage of the second FET; $K_1$ the K-value of the first FET; $K_2$ the K-value of the second FET; and $V_b$ the gate bias voltage.

Additionally, in accordance with a fourth aspect of the present invention, there is provided a semiconductor integrated circuit including at least an active load circuit which comprises a first and second FETs, wherein the drain of the first FET is connected to the source of the second FET, the drain of the second FET is connected to a high level power line, and the gates of the first and the second FET's are connected to the source of the first FET, and wherein the threshold voltage of the second FET is less than that of the first FET and the K-value of the second FET is larger than that of the first FET, and wherein the gate length of the second FET is less than that of the first FET and the gate width of the second FET is greater than that of the first FET.

Further, in accordance with a fifth aspect of the present invention, there is provided a semiconductor integrated circuit including at least an active load circuit which comprises a first and second FETs, wherein the drain of the first FET is connected to the source of the second FET, the drain of the second FET is connected to a high level power line, and the gates of the first and the second FET's are connected to the source of the first FET, and wherein the gate length of the second FET is less than that of the first FET and the gate width of the second FET is greater than that of the first FET.

Moreover, in accordance with a sixth aspect of the present invention, there is provided a semiconductor integrated circuit according to the fourth or fifth aspects of the present invention wherein the threshold voltage of the second FET is less than that of the first FET and the K-value of the second FET is larger than that of the first FET, and wherein the gate length of the second FET is less than that of the first FET and the gate width of the second FET is greater than that of the first FET, and wherein the threshold voltages and the K-values of the first and second FETs satisfy the following condition given by Equation (2):

$$V_{t2} < \{1 + \sqrt{(K_1 + K_2)}\} V_{t1} \tag{2}$$

where $V_{t1}$ denotes the threshold voltage of the first FET; $V_{t2}$ the threshold voltage of the second FET; $K_1$ the K-value of the first FET; and $K_2$ the K-value of the second FET.

The above described K-value is a well-known parameter representing the performance of an FET and is defined as follows:

$$K = g_m/V_{GS} \text{ (where } g_m = I_d/V_{GS}\text{)}$$

where $I_d$ denotes the drain current of an FET which is in a saturation state; and $V_{GS}$ is a voltage across the gate and the source of the FET. Further, the drain current $I_d$ of an FET, which is in a saturation state, is represented by the following equation (3) using the K-value as a proportional constant:

$$I_d = K(V_{GS} - V_t)^2 \quad (3)$$

where $V_t$ denotes the threshold voltage of an FET.

With the semiconductor integrated circuits of the first and the third aspects of the present invention, since the threshold voltage of the second FET is set to be less than that of the first FET and the K-value of the second FET is set to be larger than that of the first FET, the second FET has higher current capacity than that of the first FET. Further, by satisfying the condition represented by the equation (1), the first and the second FETs are brought into the saturation state and thus saturation current is generated in the circuit. The current flowing through the constant current circuit is determined by the first FET which acts as an essential current source. On the other hand, the second FET buffers the change of the voltage applied to the current source circuit and reduces the change of the drain voltage of the first FET, taking advantage of the fact that the current is proportional to the square of the voltage across the gate and the source of the FET. This results in the change of the current being very small even when the voltage applied to the constant current source circuit changes.

With the semiconductor integrated circuits of the second and the third aspects of the present invention, the gate length of the second FET is shorter than that of the first FET. It is already known that when the gate length becomes short, what is called a short channel effect is generated. As a result, the threshold voltage of the second FET becomes less than that of the first FET. Further, by setting the gate width of the second FET as larger than that of the first FET, the K-value of the second FET becomes larger than that of the first FET. Furthermore, by satisfying the condition represented by the equation (1), the first and the second FET gets into the saturation state. In addition, similarly as in case of the circuits of the first and third aspects of the present invention, the first FET acts as an essential current source. Further, the second FET buffers the change of the voltage applied to the current source circuit and reduces the change of the drain voltage of the first FET. As a consequence, a similar effect is obtained, i.e. the change in the current becomes very small even when the voltage applied to the constant current source circuit changes.

With the semiconductor integrated circuits of the fourth and the sixth aspects of the present invention, since the threshold voltage of the second FET and the K-value of the second FET are set similarly as in case of the first aspect of the present invention, the current capacity of the second FET is higher than that of the first FET. When the condition represented by the equation (2) is satisfied, the first and the second FETs are brought into the saturation state and thus, saturation current is generated in the circuit. The first FET limits current in the active load circuit and determines the current flowing through the active load circuit. Thus, the second FET reduces the change of the drain voltage of the first FET in response to the change of the current flowing through the active load circuit. This occurs because the voltage across the gate and the source of the FET is in proportion to the square root of the current flowing through the FET. Consequently, the change in the current flowing through the active load circuit is limited in the range where the FET is in the saturation state. Further, the output voltage of the active load circuit substantially changes in response to the change in the current.

With the semiconductor integrated circuits of the fifth and the sixth aspects of the present invention, the gate length of the second FET is set to be less than that of the first FET. When the gate length of the FET becomes small, the short channel effect is derived. Under the action of the short channel effect, the threshold voltage of the second FET becomes less than that of the first FET and moreover the gate width of the second FET becomes larger than that of the first FET. Thus, the K-value of the second FET becomes larger than that of the first FET. When the condition represented by the equation (2) is satisfied, the first and the second FETs are brought into the saturation state. Saturation current is produced in the circuit. Similarly as with the circuits of the fourth and sixth aspects of the present invention, the first FET limits current in the active load circuit. Furthermore, the second FET buffers the change of the drain voltage of the first FET in response to the change in the current flowing through the active load circuit. As a result, the change in the current flowing through the active load circuit is limited to a constant value in the range where the FET is in the saturation state. Further, the output voltage of the active load circuit largely changes in response to the change in the current.

Thereby, the present invention can solve the above described problems of conventional constant current circuits, and conventional active load circuits.

Further, the present invention can provide a semiconductor integrated circuit including a constant current circuit which can substantially suppress the change of the current flowing therethrough even when the voltage applied thereto varies in case of using an FET giving large channel length modulation effects. Further, in the differential amplifier, the source follower or the like using the constant current circuit, the linear relation between the input and the output signals can be improved and the distortion of the output signal can be substantially reduced.

Furthermore, the present invention can provide a semiconductor integrated circuit including an active load circuit in which the output voltage thereof can be substantially changed in response to the change of the current flowing therethrough even when the current flowing therethrough varies in case of using an FET having large channel length modulation effects. In addition, because the present invention can provide a large differential resistance, the operating rate can be increased and the power dissipation can be reduced in various kinds of switching circuits or the like using the active load circuit. As a consequence, the performance of the semiconductor integrated circuit can be improved.

BRIEF DESCRIPTION OF THE DRAWINGS

Other features, objects and advantages of the present invention will become apparent from the following description of preferred embodiments with reference to the drawings in which.

DETAILED DESCRIPTION OF PREFERRED EMBODIMENTS

Hereinafter, preferred embodiments of the present invention will be described by referring to the accompanying drawings.

Figure 1:
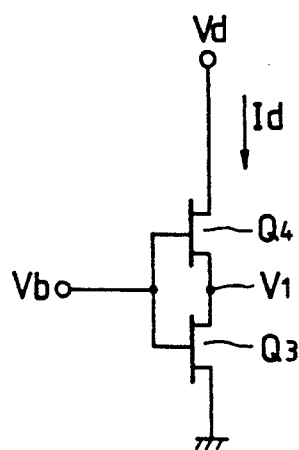
FIG. 1 is a circuit diagram of a constant current circuit illustrating a first embodiment of the present invention.

FIG. 1 is a circuit diagram of a constant current circuit embodying the present invention. As shown in this figure, the source of a second FET $Q_4$ is connected to the drain of a first FET $Q_3$. A common gate bias voltage $V_b$ is applied from an external circuit to the gates of the FETs $Q_3$ and $Q_4$. The source of the FET $Q_3$ is connected to a low level power line, that is, a ground line.

$V_1$ is an electric potential at the connecting point between the drain of the FET $Q_3$ and the source of the FET $Q_4$; $V_d$ is a voltage applied to the constant current circuit; and $V_{t1}$ and $V_{t2}$ are the threshold voltages of the FETs $Q_3$ and $Q_4$, respectively. The condition for bringing the FETs $Q_3$ and $Q_4$ into the saturation state is represented by the following set of equations (4) and (5):

$$V_1 > V_b - V_{t1} \tag{4}$$

$$V_d > V_2 - V_{t2} \tag{5}$$

The condition for drawing current into the FETs $Q_3$ and $Q_4$ is represented by the following set of equations (6) and (7):

$$V_b - V_{t1} > 0 \tag{6}$$

$$V_b - V_{t2} > V_1 \tag{7}$$

Thus, the condition for bringing the FETs into the saturation state and making the current flow through these FETs is represented by the following equation (8):

$$V_d > V_b - V_{t2} > V_1 > V_b - V_{t1} > 0 \tag{8}$$

$I_d$ is the current flowing through the constant current circuit; and $K_1$ and $K_2$ are the K-values of the FETs $Q_3$ and $Q_4$, respectively. Assuming that the current flowing through the FET behaves according to the square principle represented by the equation (3), the current flowing through the FET $Q_3$ and that flowing through the FET $Q_4$ are represented by the following equations (9) and (10), respectively:

$$I_d = K_1(V_b - V_{t1})^2 \tag{9}$$

$$I_d = K_2(V_b - V_1 V_{t2})^2 \tag{10}$$

Thus, $V_1$ is found from the equations (9) and (10) as follows:

$$V_1 = (V_b - V_{t2}) - \sqrt{(K_1/K_2)} \; (V_b - V_{t1}). \tag{11}$$

Further, the threshold voltage $V_{t2}$ of the FET $Q_4$ is set to be less than that of the FET $Q_3$, and the K-value of the FET $Q_4$ is set to be larger than that of the FET $Q_3$:

$$V_{t2} < V_{t1} \tag{12}$$

$$K_1 < K_2 \tag{13}$$

Furthermore, if the condition represented by the equation (1) is satisfied, the following equation (14) is also satisfied:

$$V_b - V_{t2} > V_1 > V_b - V_{t1} > 0 \tag{14}$$

As can be understood by comparing the equation (8) and (14) with each other, these equations (8) and (14) simultaneously hold for appropriate voltages $V_b$ and $V_d$.

Thus, if the threshold voltage and the K-value of the FET $Q_4$ are set as described above and the equation (1) is satisfied, the FETs $Q_3$ and $Q_4$ are brought into the saturation state and thus the saturation current flows through the circuit.

Since the threshold voltage and the K-value of the FET $Q_4$ are set as described above, the FET $Q_4$ has a higher current capacity in comparison with the FET $Q_3$. Further, the current flowing through the FET $Q_3$ is the same as that flowing through the FET $Q_4$. Thus, the FET $Q_3$ acts as an essential current source.

Operation of the FET $Q_4$, which is a feature of the present invention, is described hereinbelow.

In view of the channel length modulation effects, the drain current $I_4$ of an FET in the saturation state is given by equation (15):

$$I_4 = K_2(V_{gs} - V_{t2})^2(1 + \lambda V_{ds}) \tag{15}$$

where $V_{ds}$ denotes a voltage across the drain and the source of the FET $Q_4$; $V_{gs}$ is a voltage across the gate and the source of the FET $Q_4$; and $\lambda$ is a parameter representing the degree of the channel length modulation effects. The value of the parameter $\lambda$ is usually in the order of 0.05 to 0.2 (/V). The second term on the right hand of the equation (15) is in connecting with the channel length modulation effects. The voltage $V_{gs}$ is obtained from the equation (15) as follows:

$$V_{gs} = V_{t2} + \sqrt{(I_d/K_2) \cdot \{1/(1 + \lambda \; V_{ds})\}} \tag{16}$$

The current $I_d$ flows through not only the FET $Q_4$ but also through the FET $Q_3$ and, as above described, the current $I_d$ flowing through the FET $Q_3$ is given by $$I_d = K_1(V_b - V_{t1})^2 \qquad (17).$$

Then, by substituting the equation (17) into the equation (16), the following equation is obtained:

$$V_{gs} = \qquad (18)$$
$$V_{t2} + (V_b - V_{t1}) \cdot \sqrt{(K_1/K_2)} \cdot \sqrt{(I_d/K) \cdot \{1/(1 + \lambda V_{ds})\}} \ .$$

The K-values $K_1$ and $K_2$ are set such that $K_1 < K_2$, and the value of the parameter $\lambda$ is in the order from 0.02 to 0.2. The change of the voltage $V_{gs}$ in response to that of the voltage $V_{ds}$ is in proportion to the term $(1 + \lambda V_{ds})^{-\frac{1}{2}}$ and thus, is small. Even when the drain voltage of the FET $Q_4$ changes, the source voltage thereof hardly changes. Further, the source of the FET $Q_4$ is connected to the drain of the FET $Q_3$. Thus, the drain voltage of the FET $Q_3$ hardly changes and the change of the current through FET $Q_3$ becomes very small.

The function of the FET $Q_4$ is to buffer the change of the voltage applied to the constant current circuit and to reduce it to the small change of the voltage across the gate and the source of this FET, taking advantage of the fact that the current flowing therethrough is in proportion to the square of the voltage across the gate and the source thereof. As a result, the change of the drain voltage of the FET $Q_3$, which acts as a current source in response to the change of the voltage applied to the constant current circuit, becomes small. Further, the change of the current flowing through the constant current circuit becomes extremely small in comparison with conventional devices.

Figure 2:
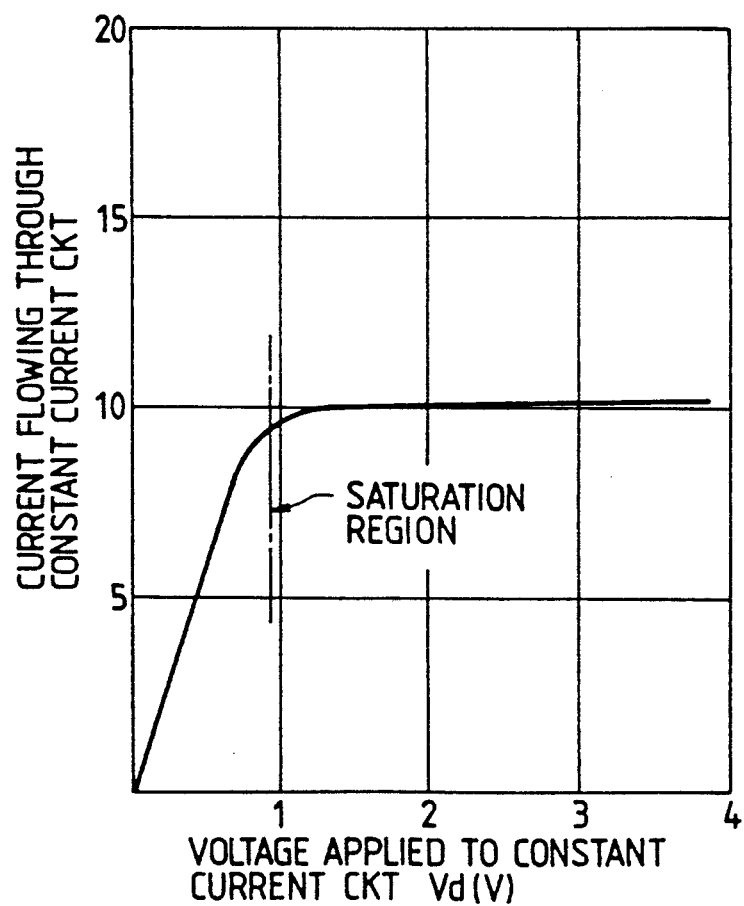
FIG. 2 is a graph showing the results of the measurement of the voltage-current characteristic of the constant current circuit of FIG. 1.

FIG. 2 shows a voltage-current characteristic of this embodiment. As is seen from this graph, in the range (that is, the saturation region) where the FET is in the saturation state, the change in the current $I_d$ caused by changes in the voltage $V_d$ becomes very small. As compared with the voltage-current characteristic of the conventional constant current circuit shown in FIG. 4, it is understood that the constant current circuit of the present invention has a good saturation characteristic and solves the problem of conventional constant current circuits.

Another preferred embodiment of the present invention is described hereinbelow.

The configuration of a constant current circuit in this embodiment is the same with that of the constant current circuit in the above described embodiment. The established values of various parameters of the constant current circuit are listed in Table 1 described hereinbelow.

TABLE 1

|  | 1st FET $Q_3$ | 2nd FET $Q_4$ |
| --- | --- | --- |
| Gate Length | 1.5 μm | 0.5 μm |
| Gate Width | 100 μm | 250 μm |
| Threshold Voltage | −0.4 V | −0.8 V |
| K-value | 15 mA/V² | 42 mA/V² |

Figure 3:
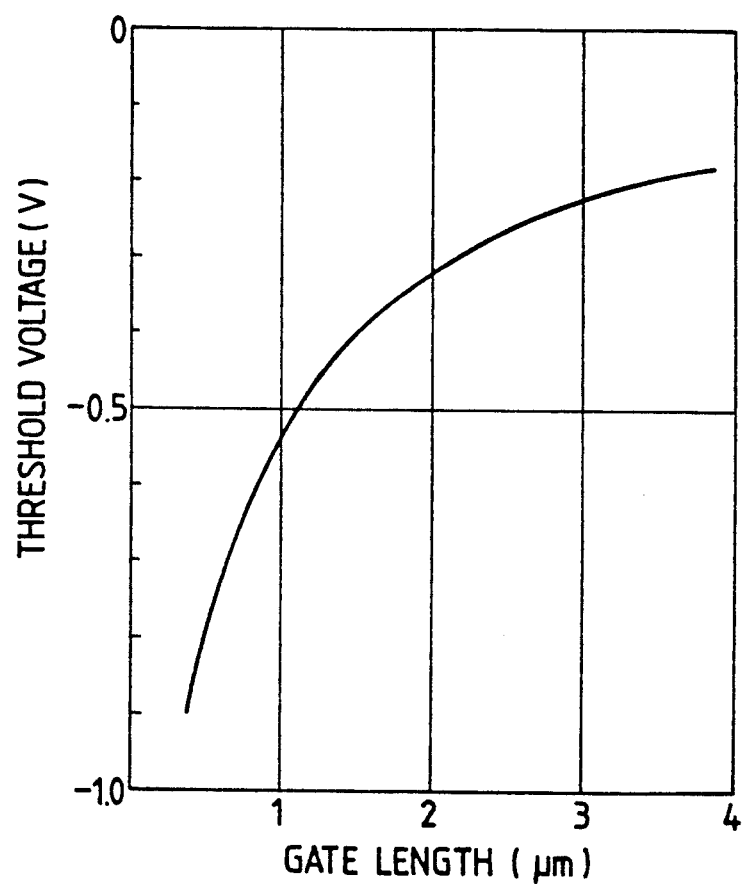
FIG. 3 is a graph showing the results of the measurement of the gate length and the threshold voltage of an FET for illustrating the short channel effect.

As is seen from Table 1, this embodiment is characterized in that the gate length of the second FET $Q_4$ is less than that of the first FET $Q_3$. As is known to those skilled in the art, when the gate length of the FET becomes small, short channel effects are obtained and thus, the threshold value of the FET becomes smaller. FIG. 3 shows the measurement of threshold voltage with respect to gate length for this embodiment. As is understood from this graph, the threshold voltage of the FET is substantially changed by changing the gate length. Thus, by appropriately setting the gate length of the FET, FETs having more than two levels of threshold voltage can be simultaneously manufactured at the same manufacturing process thereof. As a result, with respect to Table 1, the gate length of the FET $Q_3$ and that of the FET $Q_4$ are set as 1.5 μm and 0.5 μm, respectively, and further the observed values of the threshold voltages of the FET $Q_3$ and that of the FET $Q_4$ are 0.4 V and 0.8 V, respectively.

Generally, when the gate length of the FET becomes small, the K-value thereof is increased. Further, in this embodiment, the gate length of the FET $Q_4$ is set to be larger than that of the FET $Q_3$. As a consequence, the K-value of the FET $Q_4$ becomes larger than that of the FET $Q_3$.

If the above described parameters are set in this way and the gate bias voltage $V_b$ is set in such a manner to satisfy the equation (1), the FETs $Q_3$ and $Q_4$ are brought into the saturation state and thus the saturation current is generated as in the case of the previously described embodiment (hereunder sometimes referred to as a first embodiment).

The constant current circuit of the instant embodiment (hereunder referred to as a second embodiment) operates as follows. The first FET $Q_3$ acts as an essential current source. The second FET $Q_4$ buffers the change of the voltage applied to the constant current circuit and reduces it to a small change in the voltage across the gate and the source of this FET, taking the advantage of the fact that the current flowing therethrough is in proportion to the square of the voltage across the gate and the source thereof. As a result, the change of the drain voltage of the FET $Q_3$, which acts as a current source in response to the change of the voltage applied to the constant current circuit, becomes very small. Further, the change of the current flowing through the constant current circuit becomes extremely small.

Figure 4:
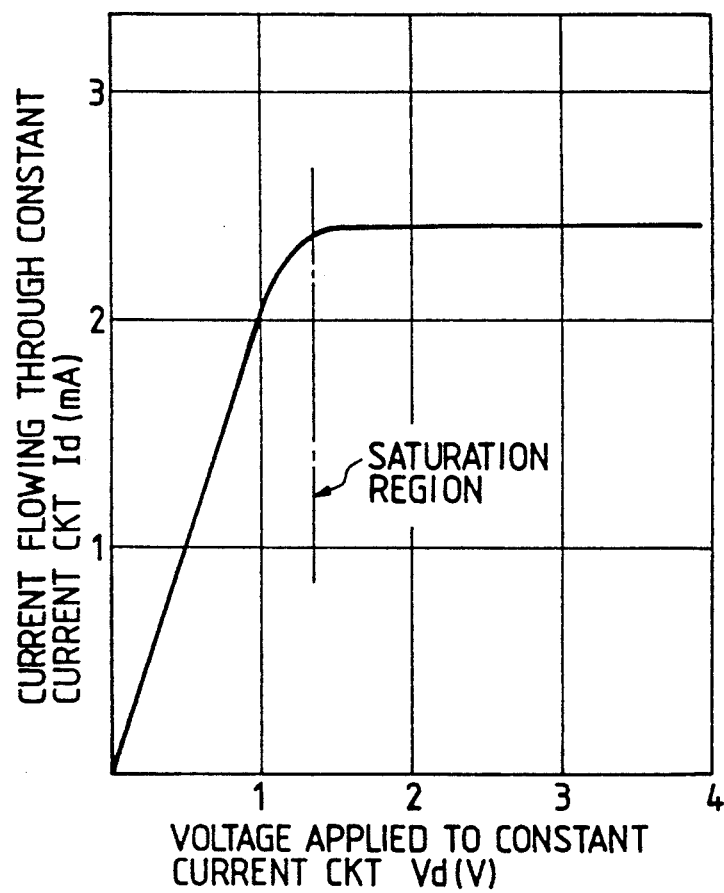
FIG. 4 is a graph showing the results of the measurement of the voltage-current characteristic of another constant current circuit embodying the present invention.

FIG. 4 shows the results of the measurement of the voltage-current characteristic of the constant current circuit of the second embodiment. As is seen from this graph, a good current characteristic is shown in the range where the FET is in the saturation state.

As is apparent from the foregoing description, by making the gate length of the second FET to be smaller than that of the first FET and the gate width of the second FET to be larger than that of the first FET, this embodiment can obtain a constant current circuit, which solves the problem encountered by conventional constant current circuits, with requiring any additional special manufacturing process.

Still another embodiment (hereunder sometimes referred to as a third embodiment) of the present invention is described hereinbelow.

Figure 5:
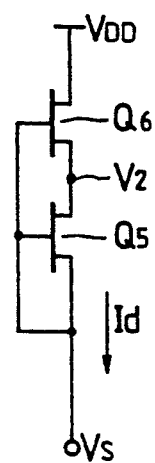
FIG. 5 is a circuit diagram of an active load circuit of another embodiment of the present invention.

FIG. 5 is a circuit diagram of an active load circuit embodying the present invention. As shown in this figure, the source of a second FET $Q_6$ is connected to the drain of a first FET $Q_5$. The drain of the FET $Q_6$ is connected to a high level power line of which the electric potential is represented by $V_{dd}$. The gates of the FETs $Q_5$ and $Q_6$ are connected to the source of the FET $Q_5$ and in addition the source of the FET $Q_5$ is used as the output $V_5$ of the active load circuit.

$V_2$ is an electric potential at the connecting point between the drain of the FET $Q_5$ and the source of the FET Q $V_s$ is a voltage applied to the active load circuit; and $V_{t1}$ and $V_{t2}$ are the threshold voltages of the FETs Q$_5$ and Q$_6$, respectively. The condition for bringing the FETs Q$_5$ and Q$_6$ into the saturation state is represented by the following set of equations (19) and (20):

$$V_2 > V_s - V_{t1} \quad (19)$$

$$V_{dd} > V_s - V_{t2} \quad (20).$$

Further, the condition for drawing current through the FETs Q$_5$ and Q$_6$ is represented by the following set of equations (21) and (22):

$$-V_{t1} > 0 \quad (21)$$

$$V_s - V_{t2} - V_{t2} > 0 \quad (22).$$

Thus, the condition for making the FETs get into the saturation state and making the current flow through these FETs are given by the following equation (23);

$$V_{dd} - V_s > -V_{t2} > V_2 - V_s > -V_{t1} > 0 \quad (23).$$

$I_d$ is the current flowing through the constant current circuit; and $K_1$, $K_2$ are the K-values of the FETs Q$_5$ and Q$_6$, respectively. Assuming that the current flowing through the FET behaves according to the square principle represented by the equation (3), the current flowing through the FET Q$_5$ and that flowing through the FET Q$_6$ are represented by the following equations (24) and (25), respectively:

$$I_d = K_1 (V_{t1})^2 \quad (24)$$

$$I_d = K_2 (V_5 - V_2 - V_{t2})^2 \quad (25).$$

Thus, $V_2$ is found from the equations (24) and (25) as follows:

$$V_2 = (V_s - V_{t2}) - \sqrt{(K_1/K_2)} \; V_{t1}. \quad (26)$$

Further, the threshold voltage $V_{t2}$ of the FET Q$_6$ is set to be less than that of the FET Q$_5$, and the K-value of the FET Q$_6$ is set to be larger than that of the FET Q$_5$:

$$V_{t2} < V_{t1} \quad (27)$$

$$K_1 < K_2 \quad (28).$$

If the condition represented by the equation (2) is satisfied, $V_2$ represented by the equation (26) satisfies the following equation (29):

$$-V_{t2} > V_2 - V_s > -V_{t1} \quad (29).$$

As can be understood by comparing the equation (29) and (23) with each other, these equations (29) and (23) simultaneously hold for appropriate voltage $V_{dd}$.

Thus, if the threshold voltage of the FET Q$_6$ is set to be less than that of the FET Q$_5$; and the K-value of the FET Q$_6$ is set to be larger than that of the FET Q$_5$; and the equation (2) is satisfied, the FETs Q$_5$ and Q$_6$ are brought into the saturation state and thus, the saturation current flows through the circuit.

Since the threshold voltage of the FET Q$_6$ is less than that of the FET Q$_5$ and the K-value of the FET Q$_6$ is larger than that of the FET Q$_5$, the FET Q$_6$ has a higher current capacity in comparison with the FET Q$_5$. Further, the current flowing through the FET Q$_5$ is the same with that flowing through the FET Q$_6$. Thus, the current flowing through the active load circuit is determined by the FET Q$_5$. That is, the first FET Q$_5$ limits the current flowing through the active load circuit.

The operation of the second FET Q$_6$, which is a feature of the present invention, is described hereinbelow.

As with equation (13), in view of the channel length modulation effects, the drain current $I_d$ of an FET in the saturation state is given by $$I_d = K_2 (V_{gs} - V_{t2})^2 (1 + \lambda V_{ds}) \quad (30)$$

where $V_{ds}$, $V_{gs}$ and $\lambda$ indicate like quantities in case of the equation (15). The value of the parameter $\lambda$ is usually in the order of 0.02 to 0.2 (/V). The voltage $V_{gs}$ is obtained from the equation (15) as follows:

$$V_{gs} = V_{t2} + \sqrt{(I_d/K_2)} \cdot \{1/(1 + \lambda V_{ds})\}.(31)$$

As described above, $I_d$ indicates the current flowing through the active load circuit. The change in the voltage $V_{gs}$ in response to changes in the current $I_d$ is reduced almost in proportion to the square root of the current $I_d$, that is, $(I_d)^{\frac{1}{2}}$ and thus, is small. As a result, the change in the drain voltage of the FET Q$_5$ in response to that of the current $I_d$ becomes very small and thus the current flowing through the active load circuit is limited to a constant magnitude.

As is seen from the foregoing description, the current flowing through the active lead circuit becomes almost constant independent of the output voltage thereof when the FET is in the saturation state.

Figure 6:
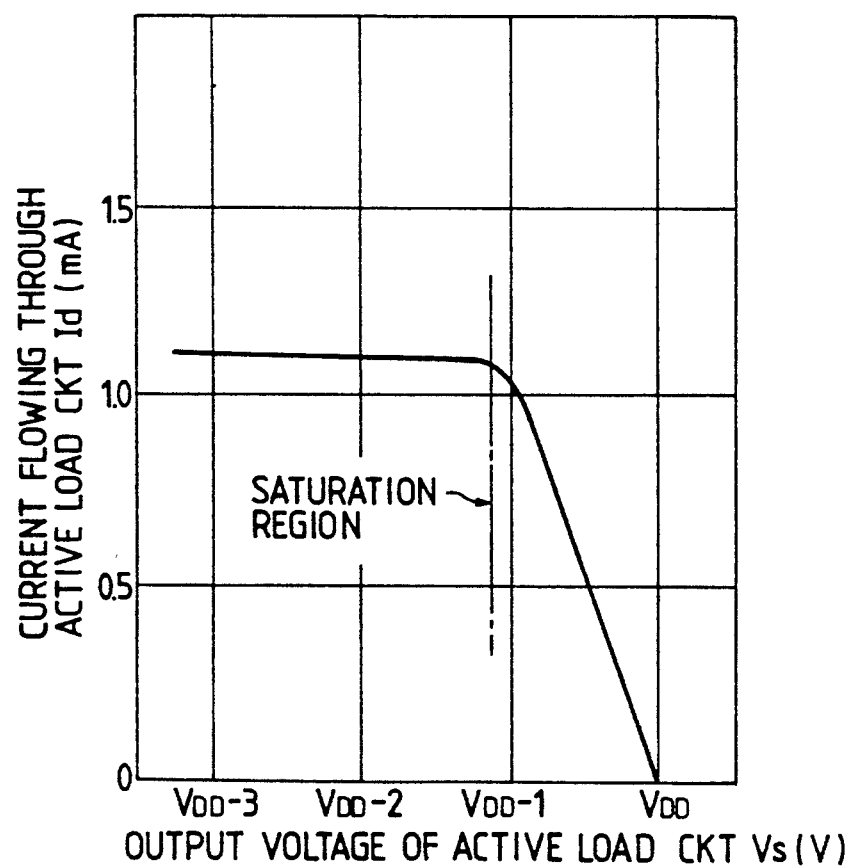
FIG. 6 is a graph showing the results of the measurement of the voltage-current characteristic of an active load circuit embodying the present invention.
Figure 7:
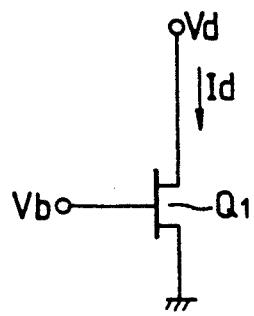
FIG. 7 is a circuit diagram of a conventional constant current circuit.
Figure 8:
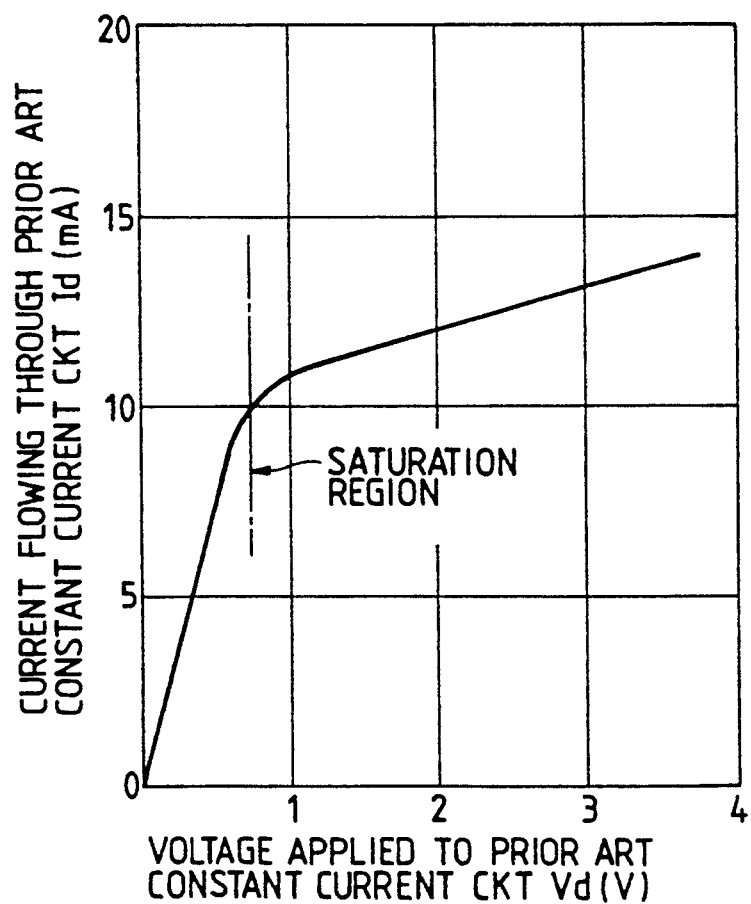
FIG. 8 is a graph showing the results of the measurement of the voltage-current characteristic of the conventional constant current circuit of FIG. 7.
Figure 9:
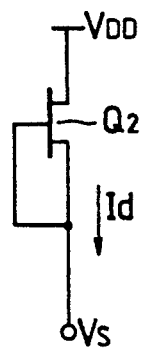
FIG. 9 is a circuit diagram of a conventional active load circuit.
Figure 10:
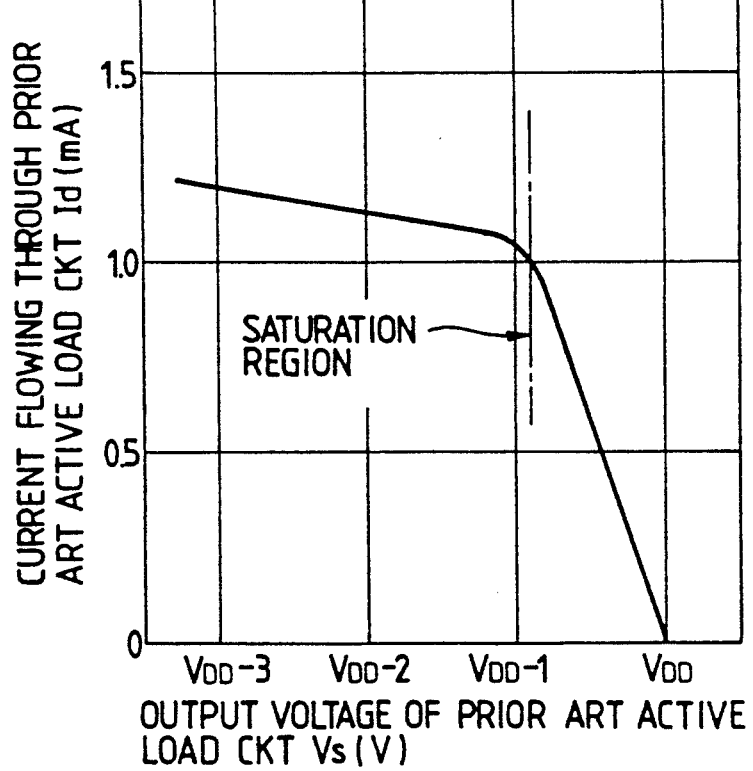
FIG. 10 is a graph showing the results of the measurement of the voltage-current characteristic of the conventional active load circuit of FIG. 9.

FIG. 6 shows a voltage-current characteristic of this embodiment. As is seen from this graph, in the range where the current $I_d$ is in the saturation state, a good constant current characteristic is exhibited and further a large differential resistance is obtained. As compared with an example of the voltage-current characteristic of the conventional active load circuit shown in FIG. 10, it is understood that the active load circuit of the present invention solves the problem of the conventional active load circuit.

Still another preferred embodiment (hereunder sometimes referred to as a fourth embodiment) of the present invention is described hereinbelow.

The configuration of an active load circuit of this embodiment is the same with that of the active load circuit in the above-described third embodiment of FIG. 5. The established values of various parameters of the constant current circuit are listed in Table 2 described hereinbelow.

TABLE 2

|  | 1st FET Q$_5$ | 2nd FET Q$_5$ |
|---|---|---|
| Gate Length | 1.5 μm | 0.5μ |
| Gate Width | 40 μm | 100μ |
| Threshold Voltage | −0.4 V | −0.8 V |
| K-value | 6.9 mA/V$^2$ | 20 mA/V$^2$ |

As is seen from Table 2, this embodiment is characterized in that the gate length of the second FET Q$_6$ is less than that of the first FET 5. As is described above in the description of the second embodiment, when the gate length of the FET becomes small, the short channel effects are obtained and thus the threshold value of the FET becomes smaller. By taking the advantage of the short channel effects, more than two kinds of the FETs each having a given threshold voltage can be manufactured without additional special manufacturing processes. FIG. 3 also shows the results of measurement of the relation between the threshold voltage of the FET and the gate length thereof. As a result, with respect to Table 2, the gate length of the FET $Q_5$ and that of the FET $Q_6$ are set as 1.5 μm and 0.5 μm, respectively, and the observed values of the threshold voltages of the FET $Q_5$ and that of the FET $Q_6$ are $-0.4$ V and $-0.8$ V, respectively.

Generally, when the gate length of the FET becomes small, the K-value thereof is increased. In this embodiment, the gate length of the FET $Q_6$ is set to be larger than that of the FET $Q_5$. As a consequence, the K-value of the FET $Q_6$ becomes larger than that of the FET $Q_5$.

If the above described parameters are set in this way and moreover the gate bias voltage $V_b$ is set in such a manner to satisfy the equation (2), the FETs $Q_5$ and $Q_6$ get into the saturation stage and thus the saturation current is generated as with the previously described first embodiment.

The active load circuit of the third embodiment and the active load circuit of the fourth embodiment operate so that the first FET $Q_5$ limits the current flowing through the active load circuit. The second FET $Q_6$ reduces the change of the drain voltage of the FET $Q_5$ in response to the change of the current $I_d$, taking the advantage of the fact that the voltage across the gate and the source of the FET is in proportion to the square root of the current $I_d$ flowing the active load circuit. As a result, the current flowing through the active load circuit remains almost constant.

The measurement of the voltage-current characteristic of the active load circuit of the fourth embodiment is the same as the example of FIG. 6. As is seen from this graph, a good saturation characteristic is shown in the range where the current flowing through the active load circuit which is in the saturation state.

As is apparent from the foregoing description, by arranging the photo mask layout so that the gate length of the second FET is made shorter than that of the first FET and the gate width of the second FET is made larger than that of the first FET, this embodiment can obtain an active load circuit, which solves the problem encountered by the conventional active load circuit, without requiring any additional manufacturing process.

While preferred embodiments of the present invention have been described above, it is to be understood that the present invention is not limited thereto and that other modifications will be apparent to those skilled in the art without departing from the spirit of the invention. The scope of the present invention, therefore, is to be determined solely by the appended claims.

What is claimed is:

1. A semiconductor integrated circuit including at least a constant current circuit which comprises first and second FETs having a same type channel, wherein a drain of said first FET is connected to a source of said second FET, a source of said first FET is connected to a low level power line, gates of said first and second FETs are connected with each other and are supplied with a same constant gate bias voltage from an external circuit, and a threshold voltage of said second FET is larger than a K-value of said first FET, where the K-value $K_1$ of said first FET and the K-value $K_2$ of said second FET are given by $$K = g_m/V$$

where $g_m = I_d/V_{gs}$ and $I_d$ denotes the drain current of an FET in a saturation state and $V_{gs}$ is a voltage across the gate and drain of an FET.

2. The semiconductor integrated circuit according to claim 1, wherein the threshold voltages and the K-values of said first and said second FETs satisfy the following condition given by $$V_b - V_{t2} > \{1 + \sqrt{(K_1 + K_2)}\}(V_b - V_{t1}) \tag{1}$$

where $V_{t1}$ denotes the threshold voltage of said first FET; $V_{t2}$ the threshold voltage of said second FET; and $V_b$ a gate bias voltage.

3. The semiconductor integrated circuit according to claim 1 wherein the gate bias voltage is higher than the threshold voltage of said first FET.

4. A semiconductor integrated circuit including at least a constant current circuit which comprises first and second FETs both having a same type of channel, wherein a drain of said first FET is connected to a source of said second FET, and a source of said first FET is connected to a low level power line, and gates of said first and second FETs are connected with each other and are supplied with a same constant gate bias voltage from an internal circuit, and wherein a gate length of said second FET is less than a gate length of said first FET, and a gate width of said second FET is larger than a gate width of said first FET.

5. The semiconductor integrated circuit according to claim 4, wherein threshold voltages and the K-values of said first and said second FETs satisfy the following condition given by $$V_b - V_{t2} > \{1 + \sqrt{(K_1 + K_2)}\}(V_b - V_{t1}) \tag{1}$$

where $V_{t1}$ denotes the threshold voltage of said first FET; $V_{t2}$ the threshold voltage of said second FET; and $V_b$ a gate bias voltage.

6. The semiconductor integrated circuit according to claim 4 wherein the gate bias voltage is higher than the threshold voltage of said first FET.

7. A semiconductor integrated circuit including at least an active load circuit which comprises first and second FETs having the same type channels, wherein a drain of said first FET is connected to a source of said second FET, and a source of said first FET is connected to a low level power line, and gates of said first and second FETs are connected together and are connected to a source of said first FET, and wherein a threshold voltage of said second FET is less than a threshold voltage of said first FET, and a K-value of said second FET is larger than a K-value of said first FET, and wherein a gate length of said second FET is less than a gate length of said first FET and a gate width of said second FET is larger than a gate width of said first FET, where the K-value $K_1$ of said first FET and the K-value $K_2$ of said second FET are given by $$K = g_m/V_{gs}$$

where $g_m = I_d/V_{gs}$ and $I_d$ denotes the drain current of an FET in a saturation state and $V_{gs}$ is a voltage across the gate and drain of an FET.

8. The semiconductor integrated circuit according to claim 7, wherein the threshold voltages and the K-values of said first and second FETs satisfy the following condition given by $$V_{t2} < \{1 + \sqrt{(K_1 + K_2)}\} V_{t1} \quad (2)$$

where $V_{t1}$ denotes the threshold voltage of said first FET; and $V_{t2}$ the threshold voltage of said second FET.

9. A semiconductor integrated circuit including at least an active load circuit which comprises first and second FETs having a same type of channel, wherein a drain of said first FET is connected to a source of said second FET, and a drain of said second FET is connected to a high level power line, and gates of said first and said second FETs are connected together and are connected to a source of said first FET, and wherein a gate length of said second FET is less than a gate length of said first FET and a gate width of said second FET is larger than a gate width of said first FET.

10. The semiconductor integrated circuit according to claim 9, wherein threshold voltages and K-values of said first and said second FETs satisfy the following condition given by $$V_{t2} < \{1 + \sqrt{(K_1 + K_2)}\} V_{t1} \quad (2)$$

where $V_{t1}$ denotes the threshold voltage of said first FET; and $V_{t2}$ the threshold voltage of said second FET.

* * * * *